(12) United States Patent
Sung et al.

(10) Patent No.: US 8,120,091 B2
(45) Date of Patent: Feb. 21, 2012

(54) NON-VOLATILE MEMORY DEVICES INCLUDING A FLOATING GATE AND METHODS OF MANUFACTURING THE SAME

(75) Inventors: Suk-Kang Sung, Gyeonggi-do (KR);
Choong-Ho Lee, Gyeonggi-do (KR);
Sang-wook Lim, Gyeonggi-do (KR);
Dong-Uk Choi, Gyeonggi-do (KR);
Hee-Soo Kang, Gyeonggi-do (KR);
Kyu-Charn Park, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 255 days.

(21) Appl. No.: 12/128,078

(22) Filed: May 28, 2008

(65) Prior Publication Data
US 2008/0296657 A1 Dec. 4, 2008

(30) Foreign Application Priority Data

May 29, 2007 (KR) .................... 10-2007-0051816
Apr. 24, 2008 (KR) .................... 10-2008-0038175

(51) Int. Cl.
*H01L 29/788* (2006.01)
(52) U.S. Cl. ........ 257/315; 257/314; 257/321; 257/324; 257/E29.309; 257/E21.422; 365/185.01; 365/185.05; 365/185.06; 365/185.24
(58) Field of Classification Search ............... 257/315, 257/321, 324, E29.129, E29.309, E21.422, 257/314; 365/185.01, 185.05, 185.06, 185.24
See application file for complete search history.

(56) References Cited

U.S. PATENT DOCUMENTS

| | | | |
|---|---|---|---|
| 6,060,741 A | 5/2000 | Huang | |
| 6,878,985 B2 * | 4/2005 | Arai et al. | 257/315 |
| 2002/0149050 A1 * | 10/2002 | Fazio et al. | 257/314 |
| 2002/0190312 A1 * | 12/2002 | Lee | 257/321 |
| 2003/0151084 A1 * | 8/2003 | Lee et al. | 257/315 |
| 2006/0255396 A1 * | 11/2006 | Nara | 257/315 |

FOREIGN PATENT DOCUMENTS

| | | |
|---|---|---|
| KR | 0398579 | 9/2003 |
| KR | 1020060011478 A | 2/2006 |
| KR | 2006-310662 | 11/2006 |
| KR | 647482 | 11/2006 |
| KR | 655780 | 12/2006 |
| KR | 1020070014880 A | 2/2007 |

OTHER PUBLICATIONS

Office Action in related corresponding Korean Patent Application No. 2007-51816; dated Apr. 27, 2008.

* cited by examiner

*Primary Examiner* — Fernando L Toledo
*Assistant Examiner* — John P Dulka
(74) *Attorney, Agent, or Firm* — Myers Bigel Sibley & Sajovec (57) ABSTRACT

A non-volatile memory device includes a substrate and a tunnel insulation layer pattern, such that each portion of the tunnel insulation pattern extends along a first direction and adjacent portions of the tunnel insulation layer pattern may be separated in a second direction that is substantially perpendicular to the first direction. A non-volatile memory device may include a gate structure formed on the tunnel insulation layer pattern. The gate structure may include a floating gate formed on the tunnel insulation layer pattern along the second direction, a first conductive layer pattern formed on the floating gate in the second direction, a dielectric layer pattern formed on the first conductive layer pattern along the second direction, and a control gate formed on the dielectric layer pattern in the second direction.

19 Claims, 9 Drawing Sheets

NON-VOLATILE MEMORY DEVICES INCLUDING A FLOATING GATE AND METHODS OF MANUFACTURING THE SAME

CROSS-REFERENCE TO RELATED APPLICATIONS

This application claims priority under 35 U.S.C. §119 to Korean Patent Application No. 2007-51816 filed join May 29, 2007 and Korean Patent Application No. 2008-38175 filed on Apr. 24, 2008, the contents of which are incorporated herein by reference in their entirety.

BACKGROUND OF THE INVENTION

The present invention relates to semiconductor devices and, more particularly to memory devices and methods of manufacturing memory devices.

Semiconductor memory devices may be divided into volatile memory devices that may have relatively fast response speed and nonvolatile memory devices that may have a slower response speed relative to the volatile memory devices. The volatile memory devices may include dynamic random access memory (DRAM) devices and static random access memory (SRAM) devices. The volatile memory device may lose data stored therein when a power supply is removed and/or turned off. The non-volatile memory devices may include erasable programmable read-only memory (EPROM) devices, electrically erasable programmable read-only memory (EEPROM) devices and/or flash memory devices. The nonvolatile memory device may maintain stored data therein even when a power supply is removed and/or turned off.

The flash memory devices may be classified into floating gate type memory devices and/or charge trapping type memory devices. A floating gate type memory device may be programmed and erased by storing and/or removing free charges into and/or from a floating gate thereof. A charge trapping type memory device may be programmed and/or erased by storing electrons and/or holes into a charge trapping layer thereof.

When a dielectric layer is formed on a floating gate of the charge trapping type memory device, the dielectric layer may have a thin thickness to achieve a desirable coupling ratio. However, when the dielectric layer has a very thin thickness, a leakage current may increase and thus may deteriorate electrical characteristics of the non-volatile memory device. Additionally, when a polysilicon layer and/or a polysilicon layer doped with impurities is used as the floating gate of tile charge trapping type memory device, data retention characteristics of the memory device may deteriorate over time such that the memory device may have a poor reliability. For example, when an N type polysilicon layer serves as the floating gate, the memory device may have bad data retention characteristics. Although a P type polysilicon layer having a work function larger than that of the N type polysilicon layer may serve as the floating gate, a threshold voltage in an erasing operation of the memory device may be considerably increased.

SUMMARY OF THE INVENTION

Some embodiments of the present invention include non-volatile memory devices that may include a substrate and a tunnel insulation layer pattern, each portion of the tunnel insulation pattern extending along a first direction, adjacent portions of the tunnel insulation layer pattern being separated in a second direction that is substantially perpendicular to the first direction. Some embodiments include a gate structure formed on the tunnel insulation layer pattern. In some embodiments, the gate structure may include a floating gate formed on the tunnel insulation layer pattern along the second direction, a first conductive layer pattern formed on the floating gate in the second direction, a dielectric layer pattern formed on the first conductive layer pattern along the second direction, and a control gate formed on the dielectric layer pattern in the second direction.

In some embodiments, the first conductive layer pattern includes a transition metal, a transition metal nitride having a conductivity, and/or a transition metal oxide having a conductivity. Some embodiments provide that the transition metal includes scandium (Sc), titanium (Ti), vanadium (V), chromium (Cr), manganese (Mn), iron (Fe), cobalt (Co), nickel (Ni), copper (Cu), zinc (Zn), yttrium (Y), zirconium (Zr), niobium (Nb), molybdenum (Mo), technetium (Tc), ruthenium (Ru), rhodium (Rh), palladium (Pd), silver (Ag), cadmium (Cd), lanthanum (La), hafnium (Hf), tantalum (Ta), tungsten (W), rhenium (Re), osmium (Os), iridium (Ir), platinum (Pt), gold (Au) and/or actinium (Ac).

In some embodiments, the transition metal nitride includes tantalum nitride (TaNx) and/or tungsten nitride (WNx) and the transition metal oxide includes ruthenium oxide (RuOx).

Some embodiments include an isolation layer pattern extending along the first direction, such that the isolation layer is configured to electrically insulate the floating gate from the first conductive layer pattern along the second direction. Some embodiments include a groove formed on an upper portion of the substrate, wherein a lower portion of the isolation layer pattern fills the groove and an tipper portion of the isolation layer pattern is disposed between each of a plurality of adjacent gate structures.

In some embodiments, the isolation layer pattern includes an upper face that is substantially higher than that of the first conductive layer pattern. Some embodiments provide that the dielectric layer pattern includes a metal oxide having a dielectric constant that is substantially higher than that of silicon oxide, that the floating gate includes polysilicon and/or polysilicon doped with impurities, and that the first conductive layer pattern includes tantalum nitride.

Some embodiments provide that the dielectric layer pattern includes aluminum oxide, lanthanum oxide, yttrium oxide, cerium oxide, tantalum oxide, vanadium oxide, zirconium oxide, hafnium aluminate, hafnium silicate and/or zirconium silicate. Some embodiments include a second conductive layer pattern that is formed between the dielectric layer pattern and the control gate. In some embodiments, the second conductive layer pattern extends along the second direction and includes a material substantially the same as that of the first conductive layer pattern.

Some embodiments of the present invention include methods of manufacturing non-volatile memory devices that include forming a tunnel insulation layer, a floating gate layer and a first conductive layer on a substrate. Methods may include etching the tunnel insulation layer, the floating gate layer and the first conductive layer along a first direction to form a tunnel insulation layer pattern, a preliminary floating gate and a first conductive layer pattern on the substrate. Some embodiments provide that the tunnel insulation layer pattern, the preliminary floating gates and the first conductive layer pattern are configured to extend along the first direction and to be spaced apart along a second direction that is substantially perpendicular to the first direction. Methods may include forming an isolation layer pattern extending in the first direction, such that the isolation layer pattern is configured to isolate the tunnel insulation layer pattern, the preliminary floating gate and the first conductive layer pattern along the second direction.

Some embodiments include forming a dielectric layer and a control gate layer on the first conductive layer pattern and the isolation layer pattern, etching the control gate layer and the dielectric layer along the second direction to form multiple control gates and a dielectric layer pattern that extend along the second direction and are separated alone the first direction. Methods may include etching the first conductive layer pattern and the preliminary floating gate along the second direction to form a first conductive layer pattern and multiple floating gates on the substrate that are spaced apart alone tile first and second directions.

In some embodiments, the first conductive layer pattern includes a transition metal, a transition metal nitride having a conductivity, and/or a transition metal oxide having a conductivity. Some embodiments provide that the transition metal includes scandium (Sc), titanium (Ti), vanadium (V), chromium (Cr), manganese (Mn), iron (Fe), cobalt (Co), nickel (Ni), copper (Cu), zinc (Zn), yttrium (Y), zirconium (Zr), niobium (Nb), molybdenum (Mo), technetium (Tc), ruthenium (Ru), rhodium (Rh), palladium (Pd), silver (Ag), cadmium (Cd), lanthanum (La), hafnium (Hf), tantalum (Ta), tungsten (W), rhenium (Re), osmium (Os), iridium (Ir), platinum (Pt), gold (Au) and/or actinium (Ac).

In some embodiments, the transition metal nitride includes tantalum nitride (TaNx) and/or tungsten nitride (WNx) and the transition metal oxide includes ruthenium oxide (RuOx). Some embodiments provide that the dielectric layer pattern includes a metal oxide having a dielectric constant that is substantially higher than that of silicon oxide, the floating gate includes polysilicon and/or polysilicon doped with impurities, and the first conductive layer pattern includes tantalum nitride.

Some embodiments include forming impurity regions at portions of the substrate adjacent at least one of the floating gates. Some embodiments include forming a second conductive layer between the dielectric layer and the control gate layer using a material that is substantially the same as that of the first conductive layer and etching the second conductive layer alone the second direction to form a second conductive layer pattern between the dielectric layer pattern and the plurality of control gates. In some embodiments, the second conductive layer pattern is configured to extend along second direction and adjacent portions of the second conductive layer pattern are separated along the first direction.

Some embodiments of the present invention include methods of manufacturing a semiconductor device that include sequentially forming a tunnel insulation layer, a floating gate layer, a first conductive layer and an etching stop layer on a substrate. Methods may include sequentially etching the etching stop layer, the first conductive layer, the floating gate layer, the tunnel insulation layer and an upper portion of the substrate along a first direction to form a tunnel insulation layer pattern, a preliminary floating gate, a first conductive layer pattern and an etching stop layer pattern extending along the first direction and separated along a second direction that is substantially perpendicular to the first direction. Some embodiments provide that the sequential etching is operative to form multiple grooves extending along the first direction and that are spaced apart along the second direction.

Methods may include forming an isolation layer filling up the grooves on the substrate, the tunnel insulating layer pattern, the preliminary floating gate, the first conductive layer pattern and the etching stop layer pattern and partially removing the isolation layer until the etching stop layer pattern is exposed, to form an isolation layer pattern. Some embodiments of such methods include removing the etching stop layer pattern, forming a dielectric layer and a control gate layer on the first conductive layer pattern and the isolation layer pattern, and etching the control gate layer, the dielectric layer, the first conductive layer pattern and the preliminary floating gate along the second direction to form multiple control gates and a dielectric layer pattern extending along the second direction and spaced apart along the first direction. In some embodiments, the etching is operative to form a first conductive layer pattern and a floating gate separated along the first and the second directions.

Some embodiments provide that the first conductive layer pattern includes a transition metal, a transition metal nitride having a conductivity and/or a transition metal oxide having a conductivity. In some embodiments, the floating gate includes polysilicon and/or polysilicon doped with impurities and the first conductive layer pattern includes tantalum nitride. Some embodiments include forming a second conductive layer between the dielectric layer and the control gate layer using a material substantially the same as that of the first conductive layer and etching the second conductive layer along the second direction to form a second conductive layer pattern between the dielectric layer pattern and the control gates. In some embodiments, the second conductive layer pattern extends along the second direction and adjacent portions of the second conductive layer pattern are separated along the first direction.

DESCRIPTION OF THE EMBODIMENTS

The present invention is described more fully hereinafter with reference to the accompanying drawings, in which example embodiments of the present invention are illustrated. The present invention may, however, be embodied in many different forms and should not be construed as limited to the example embodiments set forth herein. Rather, these embodiments are provided so that this disclosure will be thorough and complete, and will fully convey the scope of the present invention to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being, "directly on," "directly connected to" or "directly coupled to" another element or layer, there are no intervening elements or layers present. Like reference numerals refer to like elements throughout. As used herein, the term "and/or" includes any and all in a mixture of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in tile figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments of the present invention are described herein with reference to cross-section illustrations that are schematic illustrations of idealized embodiments (and intermediate structures) of the present invention As such, variations from the shapes of the illustrations as a result, for example, of manufacturing techniques and/or tolerances, are to be expected. Thus, example embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1:
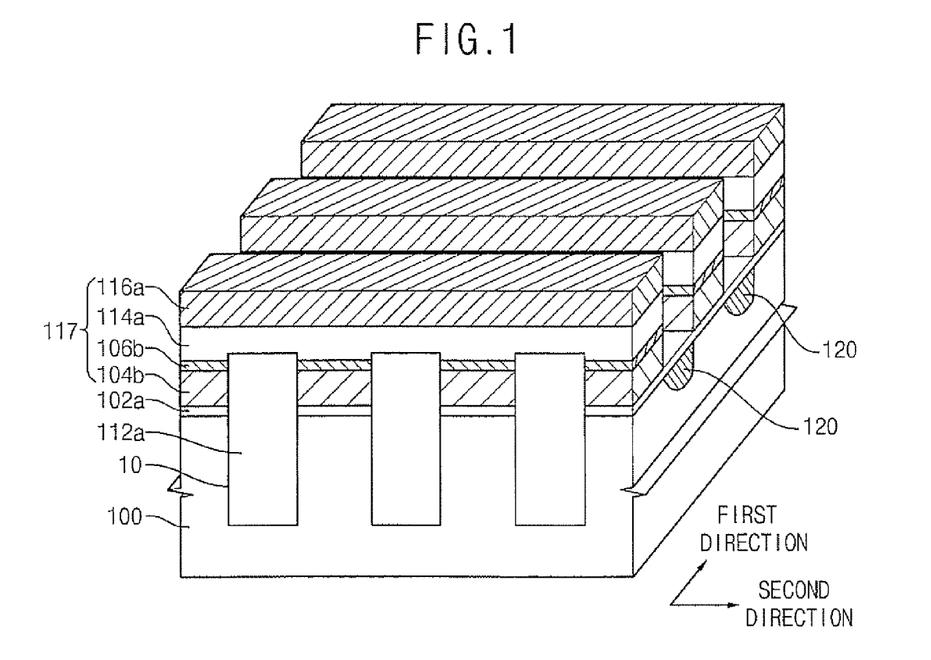
FIG. 1 is a perspective view illustrating a non-volatile memory device in accordance with some embodiments of the present invention.

Reference is made to FIG. 1, which is a perspective view illustrating a non-volatile memory device in accordance with some embodiments of the present invention. A non-volatile memory device may include substrate 100, tunnel insulation layer patterns 102a and gate structures 117.

In some embodiments, each of the tunnel insulation layer patterns 102a may include an insulating material such as silicon oxide, silicon nitride, and/or silicon oxynitride, among others. The tunnel insulation layer patterns 102a may extend on the substrate 100 along a first direction. Some embodiments provide that the tunnel insulation layer patterns 102a may be spaced apart from each other along a second direction that is substantially perpendicular to the first direction.

In some embodiments, each of the gate structures 117 may include a floating gate 104b, a first conductive layer pattern 106b, a dielectric layer pattern 114a, and/or a control gate 116a. Some, embodiments provide that the floating gate 104b may include a conductive material such as pure polysilicon, and/or polysilicon doped with impurities among others. For example, in some embodiments, the floating gate 104b may include polysilicon doped with N type impurities such as arsenic (As), phosphorous (P), and/or antimony (Sb), among others and/or polysilicon doped with P type impurities such as boron (B), and/or gallium (Ga), among others. In some embodiments, the P type impurities doped in polysilicon may include a concentration below about $10^{21}$ units/cm$^3$. Some embodiments provide that the floating gate 104b is located on the tunnel insulation layer pattern 102a and may extend along the second direction.

In some embodiments, the first conductive layer pattern 106b may include a transition metal having a desired conductivity, a transition metal nitride having a predetermined conductivity, and/or a transition metal oxide having a desired conductivity, among others. Some embodiments provide that the transition metal may include scandium (Sc), titanium (Ti), vanadium (V), chromium (Cr), manganese (Mn), iron (Fe), cobalt (Co), nickel (Ni), copper (Cu), zinc (Zn), yttrium (Y), zirconium (Zr), niobium (Nb), molybdenum (Mo), technetium (Tc), ruthenium (Ru), rhodium (Rh), palladium (Pd), silver (Ag), cadmium (Cd), lanthanum (La), hafnium (Hf), tantalum (Ta), tungsten (W), rhenium (Re), osmium (Os), iridium (Ir), platinum (Pt), gold (Au), and/or actinium (Ac), among others. These may be used alone or in a combination thereof. Some embodiments provide that the transition metal nitride may include tantalum nitride (TaNx), and/or tungsten nitride (WNx), among others. These may be used alone or in a combination thereof. In some embodiments, the transition metal oxide may include ruthenium oxide (RuOx). Some embodiments provide that the first conductive layer pattern 106b positioned on the floating gate 104b may extend along the second direction.

In some embodiments, the first conductive layer pattern 106b may prevent silicon in the floating gate 104b and/or oxygen in tile dielectric layer pattern 114a from being combined with each other. In this manner, a formation of a low dielectric layer between the floating gate 104b and the dielectric layer pattern 114a may be prevented. Some embodiments provide that tile memory device may have improved data retention characteristics because of the first conductive layer pattern 106b.

In some embodiments, the dielectric layer pattern 114a may be formed on the first conductive layer pattern 106b. Some embodiments provide that the dielectric layer pattern 114a may extend along the second direction. In some embodiments, the dielectric layer pattern 114a may include a dielectric material having a desired dielectric constant substantially higher than that of silicon oxide. Some embodiments provide that the dielectric material may include metal oxides such as aluminum oxide, lanthanum oxide, yttrium oxide, tantalum oxide, vanadium oxide, zirconium oxide, hafnium aluminate, hafnium silicate, and/or zirconium silicate, among others. These may be used alone or in a combination thereof. In some embodiments, the dielectric layer pattern 114a may be doped with elements in Group IV. The dielectric layer pattern 114a may have a single layer structure and/or a multi-layer structure.

Some embodiments provide that the control gate 116a may extend on the dielectric layer pattern 114a along the second direction. In some embodiments, the control gate 116a may include a conductive material such as poly-silicon doped with impurities and/or a metal compound, among others.

Some embodiments provide that grooves 10 extending along the first direction may be formed at an upper portion of the substrate 100. In some embodiments, the grooves 10 may be spaced apart from each other along the second direction. An isolation layer pattern 112a may fill up the grooves 10 and extend along the first direction. In some embodiments, isolation layer patterns 112a may be separated from each other in the second direction. Some embodiments provide that each of the isolation layer patterns 112a may include an insulating material such as silicon oxide.

As illustrated in FIG. 1, a lower portion of the isolation layer pattern 112a may fill up the grooves 10 and an upper portion of the isolation layer pattern 112a may be disposed in a space provided among the tunnel insulation layer patterns 102a, the floating gates 104b and/or the first conductive layer patterns 106b. Some embodiments provide that the isolation layer pattern 112a may have an upper face substantially higher than that of the first conductive layer pattern 106b. Accordingly, the floating gates 104b and the first conductive layer patterns 106b on the floating gates 104b may be insulated from one another along the second direction.

In some embodiments, each of the gate structures 117 may extend along the second direction. Some embodiments provide that the gate structures 117 may be spaced apart from each other along the first direction.

Impurity regions may be formed at upper portions of substrate 100 adjacent the gate structures 117. In some embodiments, the impurity region may serve as source/drain regions.

As illustrated in FIG. 1, the tunnel insulation layer patterns 102a extending along the first direction may be spaced apart from each other along the second direction. In some embodiments, the floating gates 104b may be separated from each other along the first and the second directions. The dielectric layer patterns 114a extending along the second direction may be spaced apart from each other along the first direction. Some embodiments provide that the control gates 116a extending along the second direction may be separated from each other along the first direction.

Some embodiments provide that the transition metal may have a high work function. When the first conductive layer pattern 106a of the transition metal is formed between the floating gate 104b and the dielectric layer pattern 114a, an energy barrier between the floating gate 104b and the dielectric layer pattern 114a may become higher. Accordingly, a leakage current flowing through the dielectric layer pattern 114a may be reduced. Although an equivalent oxide thickness (EOT) may be reduced so as to achieve a desirable coupling ratio of the memory device, the leakage currents may be effectively reduced.

Reference is made to FIGS. 2 to 8, which are perspective views illustrating methods of manufacturing non-volatile memory devices in accordance with some embodiments of the present invention. In some embodiments, a tunnel insulation layer 102, a floating gate layer 104, a first conductive layer 106, an etching stop layer 108, and/or a first mask 110a may be sequentially formed on a substrate 100.

Figure 2:
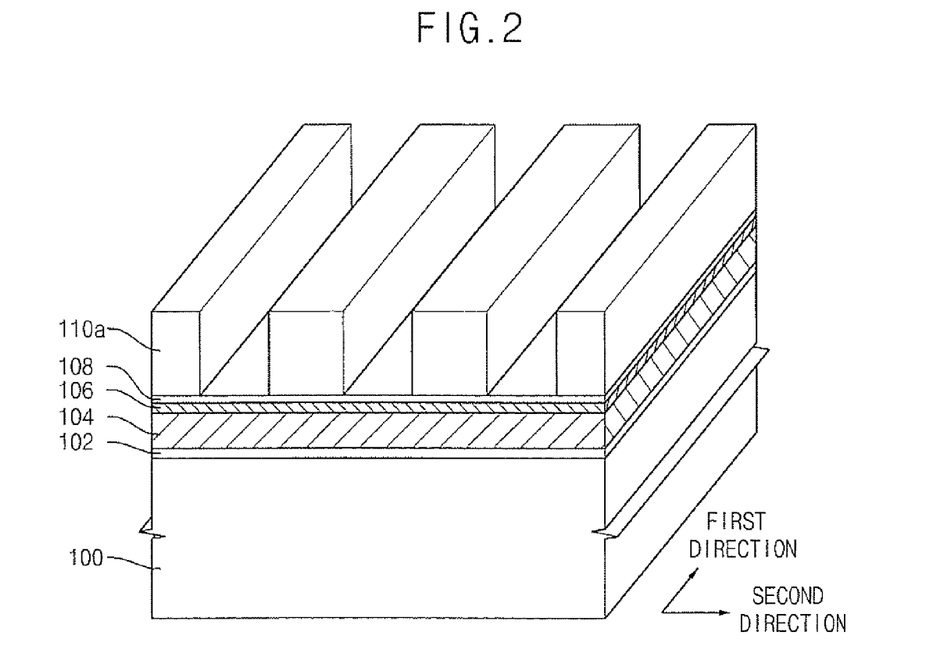
FIGS. 2 to 8 are perspective views illustrating methods of manufacturing non-volatile memory devices in accordance with some embodiments of the present invention.

Some embodiments provide that the tunnel insulation layer 102 may be formed on the substrate 100 using an insulating material such as silicon oxide, among others. In some embodiments, the tunnel insulation layer 102 may be formed by a thermal oxidation process. The floating gate 104b may be formed using a conductive material such as pure polysilicon, and/or polysilicon doped with impurities, among others. In some embodiments, the floating gate 104b may include polysilicon doped with N-type impurities such as arsenic, phosphorous, and/or antimony, among others and/or polysilicon doped with P-type impurities such as boron, and/or gallium, among others. Some embodiments provide that these impurities may be doped in polysilicon by an in-situ process.

In some embodiments, the first conductive layer 106 may be formed using a transition metal, a transition metal nitride having a desired conductivity, and/or a transition metal oxide having a predetermined conductivity, among others. Some embodiments provide that the transition metal may include scandium, titanium, vanadium, chromium, manganese, iron, cobalt, nickel, copper, zinc, yttrium, zirconium, niobium, molybdenum, technetium, ruthenium, rhodium, palladium, silver, cadmium, lanthanum, hafnium, tantalum, tungsten, rhenium, osmium, iridium, platinum, gold, and/or actinium, among others. These may be used alone or in a combination thereof. In some embodiments, the transition metal nitride may include tantalum nitride and/or tungsten nitride, among others. These may be used alone or in a combination thereof. Some embodiments provide that the transition metal oxide may include ruthenium oxide.

In some embodiments, each of the first masks 110a may have a shape extending along the first direction. The first masks 110a may be spaced apart from each other along the second direction that is substantially perpendicular to the first direction.

Figure 3:
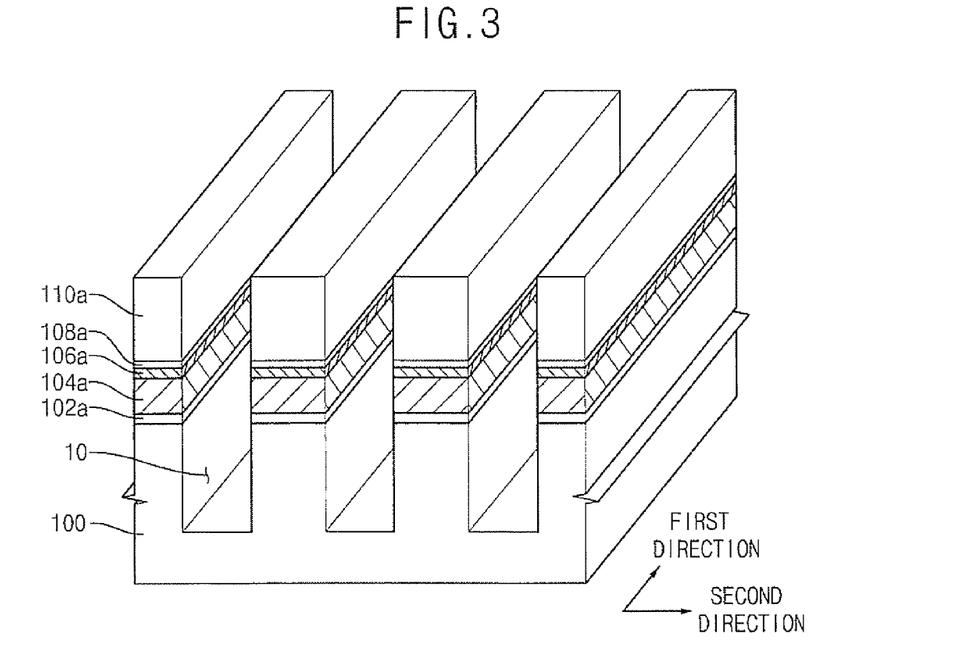

Referring to FIG. 3, the etching stop layer 108, the first conductive layer 106, the floating gate layer 104 and/or the tunnel insulation layer 102 may be sequentially etched along the first direction using the first masks 110a as etching masks.

In this manner, an etching stop layer pattern 108a, a first preliminary conductive layer pattern 106a, a preliminary floating gate 104a and/or a tunnel insulation layer pattern 102a may be provided on the substrate 100. When the etching stop layer pattern 108a, the first preliminary conductive layer pattern 106a, the preliminary floating gate 104a and/or the tunnel insulation layer pattern 102a are formed, a groove 10 may be provided on an upper portion of the substrate 100.

As described above, in some embodiments, the first masks 110a may be elongated in the first direction and spaced apart from each other along the second direction that is substantially perpendicular to the first direction. In this regard, each of the etching stop layer pattern 108a, the first preliminary conductive layer pattern 106a, the preliminary floating gate 104a, the tunnel insulation layer pattern 102a and/or the groove 10 may extend along the first direction because the etching stop layer 108, the first conductive layer 106, the floating gate layer 104, the tunnel insulation layer 102 and/or the substrate 100 are etched using the first masks 110a.

In some embodiments, adjacent etching stop layer patterns 108a may be separated from each other along the second direction and/or adjacent first preliminary conductive layer pattern 106a may be spaced apart from in the second direction. Some embodiments provide that adjacent preliminary floating gates 104a may be spaced apart from each other along the second direction and/or adjacent tunnel insulation layer patterns 102a may be separated in the second direction. In some embodiments, adjacent grooved 10 may be spaced apart from each other in the second direction.

Figure 4:
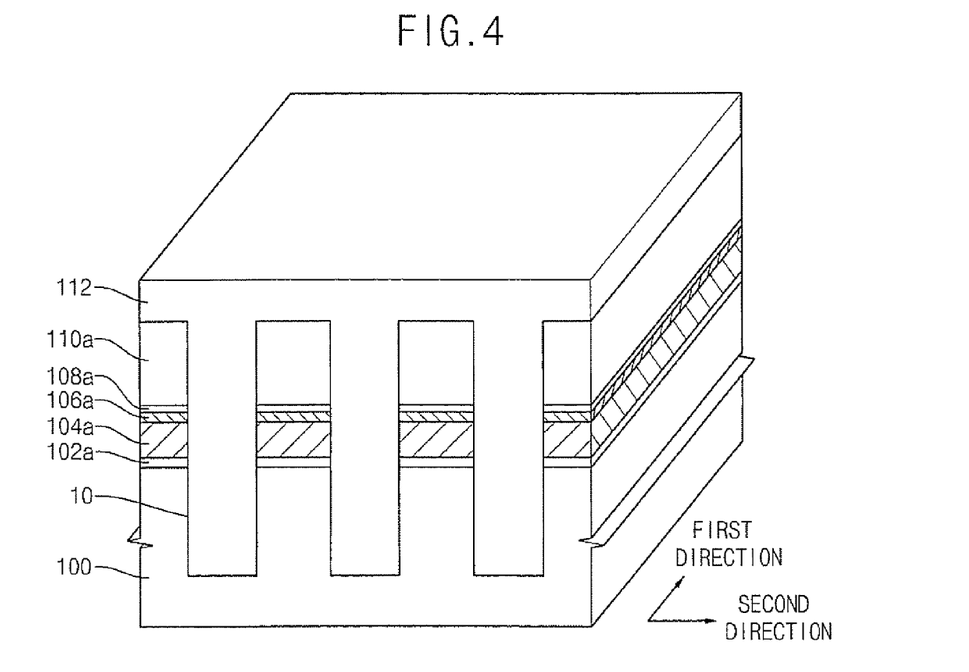

Referring to FIG. 4, an isolation layer 112 may be formed oil the substrate 100 to cover the tunnel insulation layer pattern 102a, the preliminary floating gate 104a, the first preliminary conductive layer pattern 106a, the etching stop layer pattern 108a and/or the first masks 110a. In some embodiments, the isolation layer 112 may fill Up the groove 10. The isolation layer 112 may be formed by a depositing a silicon oxide onto the substrate 100, the tunnel insulation layer pattern 102a, the preliminary floating gate 104a, the first preliminary conductive layer pattern 106a, the etching stop layer pattern 108a and/or the first masks 110a. Some embodiments provide that the isolation layer 112 may be formed by a chemical vapor deposition (CVD) process.

In some embodiments, the first masks 110a may be removed from the etching stop layer pattern 108a. The isolation layer 112 filling the groove 10 may be formed on the substrate 100 to cover the tunnel insulation layer pattern 102a, the preliminary floating gate 104a, the first preliminary conductive layer pattern 106a and/or the etching stop layer pattern 108a.

Figure 5:
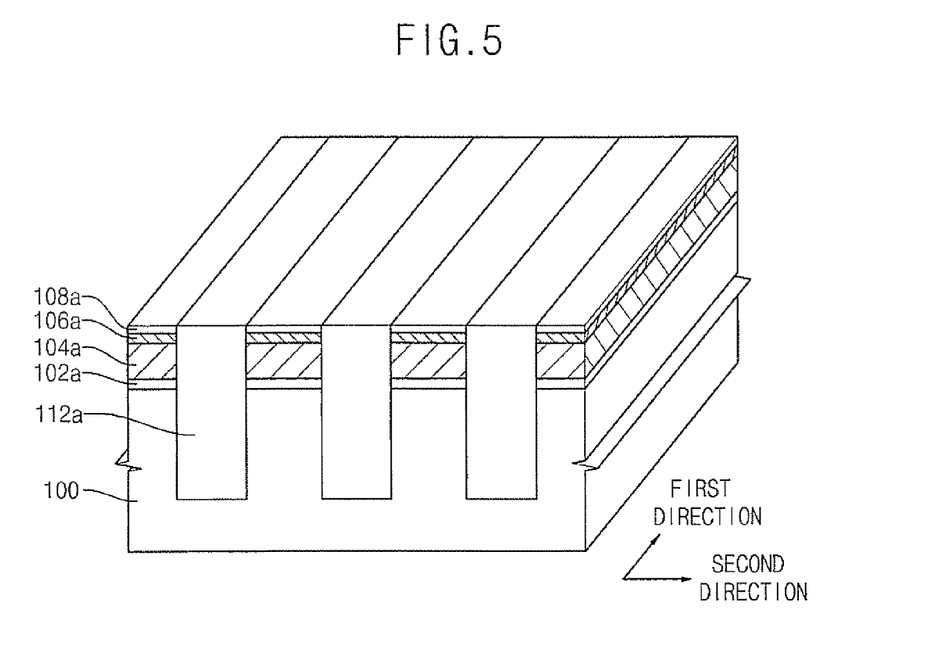

Referring FIG. 5, a planarization process may be performed about the isolation layer 112 until an upper face of the etching stop layer pattern 108a is exposed. In some embodiments, the planarization process may include a chemical mechanical polishing (CMP) process and/or an etch-back process. An upper portion of the isolation layer 112 and the first masks 110a may be removed in the planarization process. Accordingly, an isolation layer pattern 112a may be formed to fill up the groove 10. An upper face of the etching stop layer pattern 108a and/or an upper face of isolation layer pattern 112a may be disposed on a substantially same plane.

Figure 6:
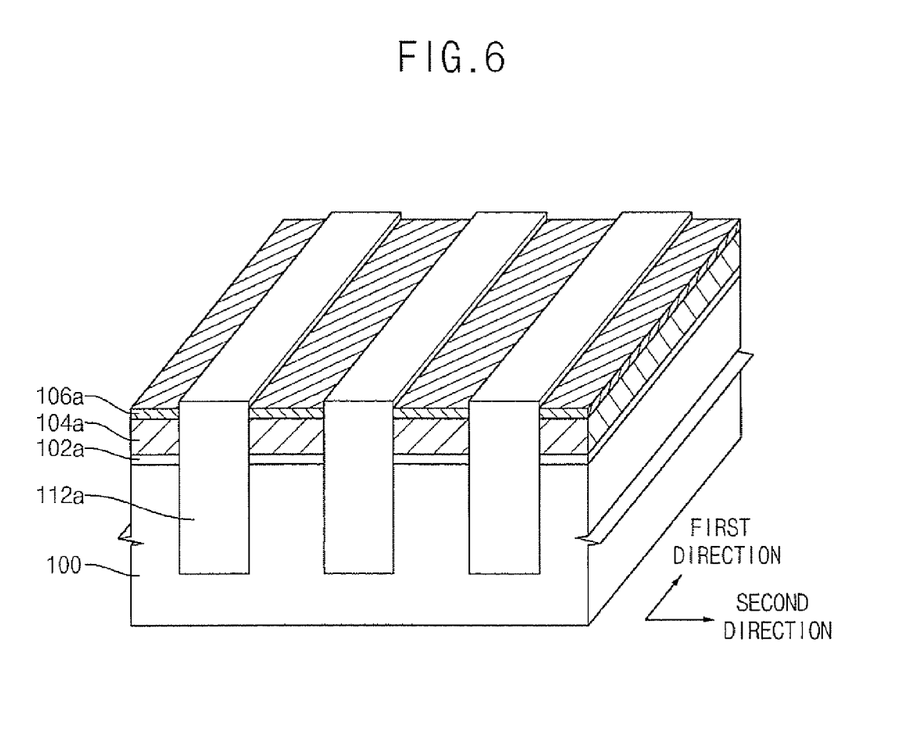

Referring to FIG. 6, the etching stop layer pattern 108a may be removed from the first preliminary conductive layer pattern 106a to expose the first preliminary conductive layer pattern 106a. When the planarization process is performed, some embodiments provide that the etching stop layer pattern 108a protects the first preliminary conductive layer pattern 106a. In this regard, the first preliminary conductive layer pattern 106a may not get damaged by the planarization process. In some embodiments of the present invention, the isolation layer pattern 112a may have an upper face substantially higher than that of the first preliminary conductive layer pattern 106a.

Figure 7:
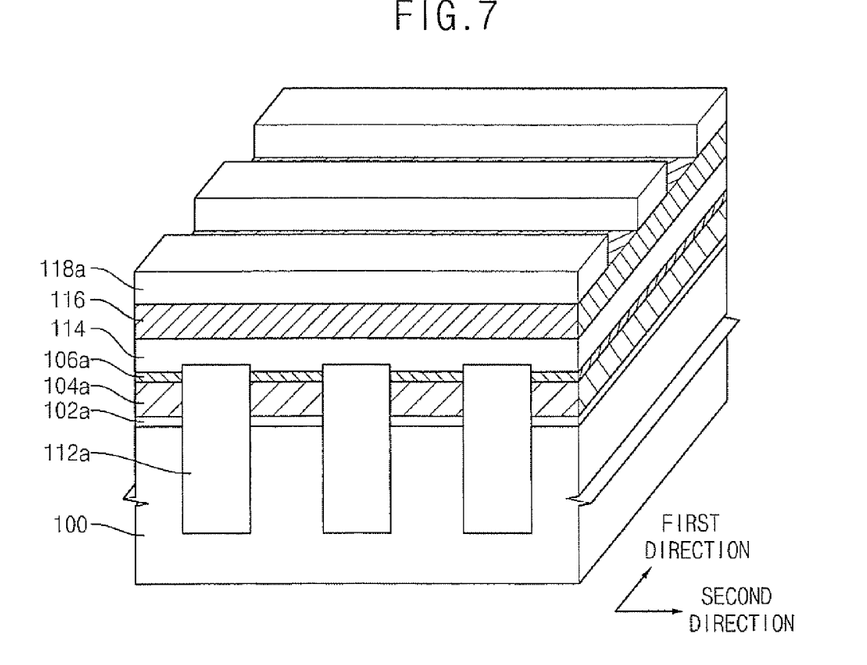

Referring to FIG. 7, a dielectric layer 114, a control gate layer 116 and/or a second mask 118a may be sequentially formed on the first preliminary conductive layer pattern 106a and the isolation layer pattern 112a. Some embodiments provide that the dielectric layer 114 may be formed using a dielectric material having a dielectric constant substantially higher than that of silicon oxide. In some embodiments, the dielectric material may include a metal oxide such as aluminum oxide, lanthanum oxide, yttrium oxide, cerium oxide, tantalum oxide, vanadium oxide, zirconium oxide, hafnium aluminate, hafnium silicate, and/or zirconium silicate, among others. These may be used alone or in a combination thereof. Some embodiments provide that the dielectric layer 114 may be doped with elements in Group IV. In some embodiments, the dielectric layer 114 may be formed to have a single layer structure or a multi-layer structure.

Some embodiments provide that the control gate layer 116 on the dielectric layer 114 may be formed using a conductive material such as polysilicon doped with impurities. In some embodiments, the dielectric layer 114 may be directly formed on the preliminary floating gate 104a including polysilicon doped with impurities and a source gas including a metal may be evaporated and/or deposited onto the preliminary floating gate 104a. Some embodiments provide that an oxygen gas may be used to remove ligands combined with a portion of the source gas and to stabilize a metal oxide. The oxygen gas may partially react with polysilicon doped with impurities in the preliminary floating gate 104a to thereby form a native oxide film on tile preliminary floating gate 104a. In some embodiments, the dielectric layer 114 may be provided on the first preliminary conductive layer pattern 106a positioned on the preliminary floating gate 104a, so that the formation of the native oxide film may be effectively prevented.

In some embodiments, the second mask 118a on the control gate layer 116 may extend along the second direction. Some embodiments provide that adjacent ones of the second masks 118a may be separated along the first direction. The second mask 118a may be formed using a material having an etching selectivity with respect to those of the control gate layer 116, the dielectric layer 114, the first preliminary conductive layer 106a and/or the preliminary floating gate 104a.

Figure 8:
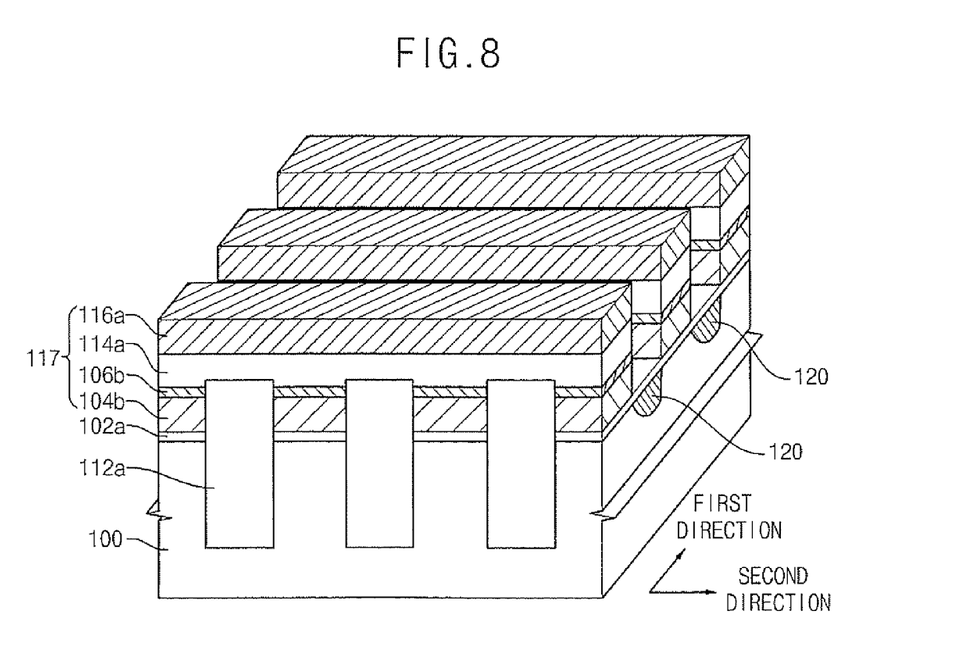

Referring to FTC. 8, the control gate layer 116, the dielectric layer 114, the first preliminary conductive layer 106a, and/or the preliminary floating gate 104a may be partially etched along the second direction until an upper face of the isolation layer pattern 112a is exposed using the second mask 118a as an etching mask. Accordingly, some embodiments provide that a control gate 116a, a dielectric layer pattern 114, a first conductive layer pattern 106b and/or a floating gate 104b may be provided on the substrate 100 by etching the control gate layer 116, the dielectric layer 114, the first preliminary conductive layer 106a and/or the preliminary floating gate 104a.

In some embodiments, impurities are injected into upper portions of the substrate 100 adjacent to the floating gate 104b so that impurity regions 120 may be provided. Some embodiments provide that the impurity regions 120 may serve as source/drain regions. The second mask 118a may then be removed.

In some embodiments, a gate structure 117 including the floating gate 104b, the first conductive layer pattern 106b, the dielectric layer pattern 114a and/or the control gate 116a may be provided on the substrate 100. As illustrated in FIG. 8, the gate structure 117 may extend along the second direction. Some embodiments provide that adjacent gate structures 117 may be separated along the second direction. As a result, the non-volatile memory device including the impurity regions 120, the tunnel insulation layer pattern 102a and/or the gate structure 117 may be provided on the substrate 100.

As described above, in some embodiments, the second mask 118a may extend along the second direction. Adjacent second masks 118a may be spaced apart along the first direction. The control gate 116a and the dielectric layer pattern 114a may extend along the second direction. In some embodiments, the control gate 116a and the dielectric layer pattern 114a may be formed by etching the control gate layer 116 and the dielectric layer 114 using the second mask 118a as the etching mask. In some embodiments, adjacent control gates 116a may be spaced apart along the first direction and adjacent dielectric patterns 114a may be separated along the first direction. Some embodiments provide that the first conductive layer pattern 106a may be formed by etching the preliminary conductive layer pattern using the second mask 118a as the etching mask. Adjacent first conductive layer patterns 106a may be spaced apart along the first and the second directions. Some embodiments provide that the floating gate 104b may be formed by etching the preliminary floating gate 104a using the second mask 118a. Adjacent floating gates 104b may be separated along the first and/or the second directions.

Figure 9:
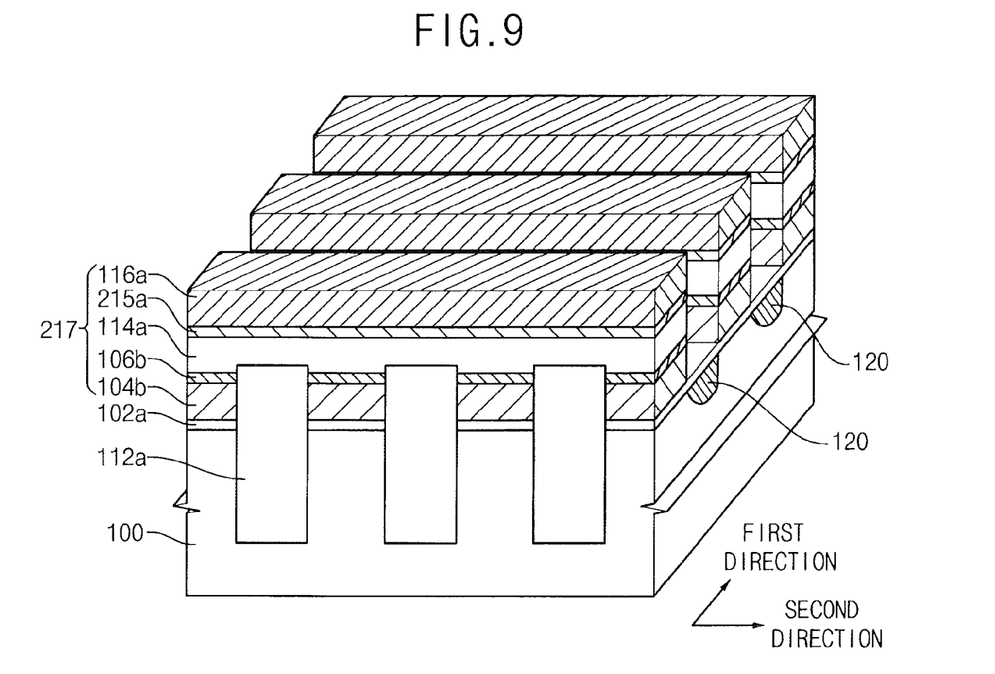
FIG. 9 is a perspective view illustrating a non-volatile memory device in accordance with some embodiments of the present invention.

Reference is now made to FIG. 9, which is a perspective view illustrating a non-volatile memory device in accordance with some embodiments of the present invention. In some embodiments, the non-volatile memory device may have a construction substantially the same as that of the non-volatile memory device described with reference to FIG. 1 except a gate structure 217.

Some embodiments provide that the gate structure 217 includes a floating gate 104b, a first conductive layer pattern 106b, a dielectric layer pattern 114a, a second conductive layer pattern 215a, and/or a control gate 116a. Some embodiments provide that the floating gate 104b, the first conductive layer pattern 106b, the dielectric layer pattern 114a and/or the control gate 116a may be substantially the same as those described with reference to FIG. 1.

In some embodiments, the second conductive layer pattern 215a may be disposed in a space between the dielectric layer pattern 114a and the control gate 116a. Some embodiments provide that the second conductive layer pattern 215a may extend along the second direction. In some embodiments, the second conductive layer pattern 215a may include a material substantially the same that of the first conductive layer pattern 106b. Some embodiments provide that a transition metal may have a high work function. When the first and the second conductive layer patterns 106a and 215a are formed using the transition metal, one energy barrier between the floating gate 104b and the dielectric layer pattern 114a, and another energy barrier between the dielectric layer pattern 114a and the control gate 116a may be increased. In some embodiments, a leakage current flowing through the dielectric layer pattern 114a may be reduced to ensure a desirable coupling ratio of the non-volatile memory device although an equivalent oxide thickness (EOT) may be reduced.

Figure 10:
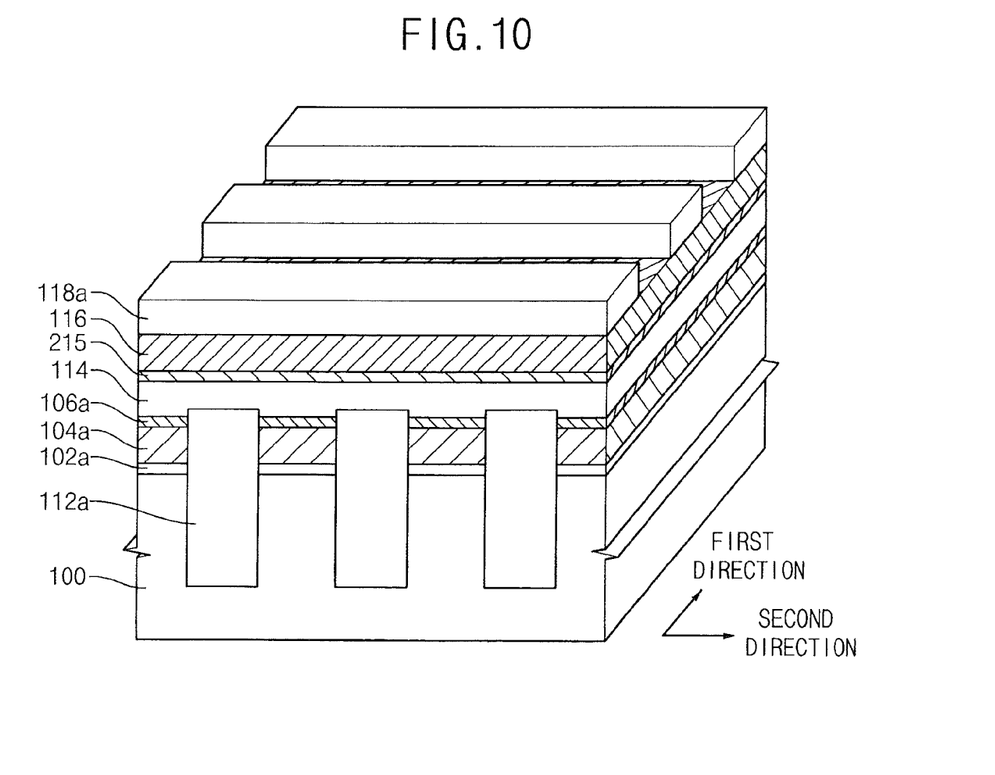
FIGS. 10 to 11 are perspective views illustrating methods of manufacturing non-volatile memory devices in accordance with some embodiments of the present invention.
Figure 11:
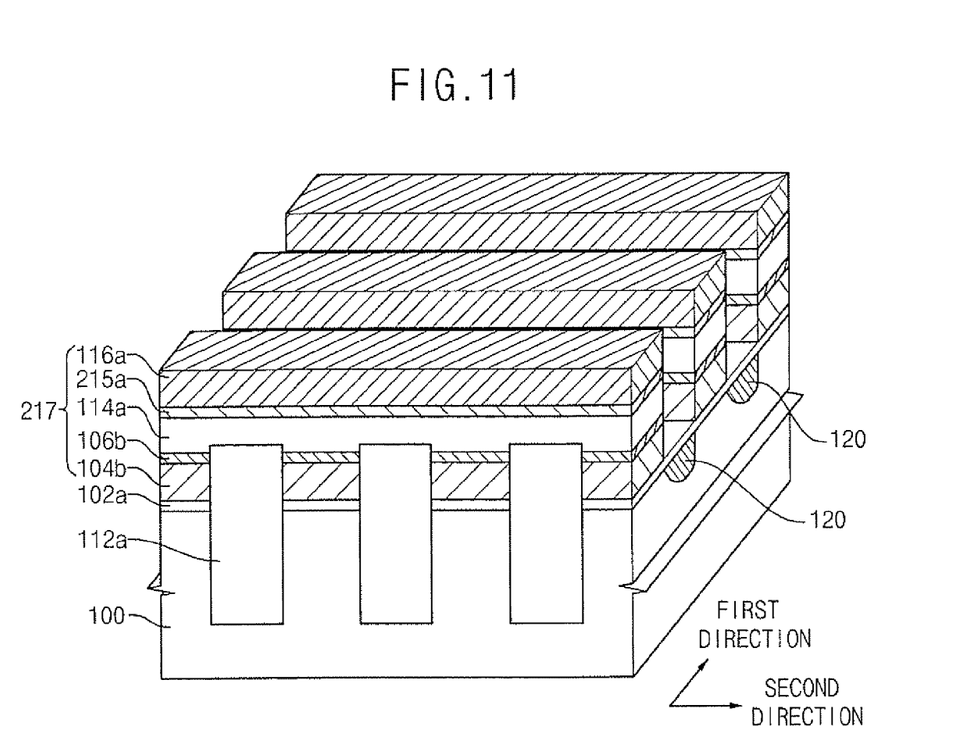

Reference is made to FIGS. 10 to 11, which are cross-sectional views illustrating methods of manufacturing non-volatile memory devices in accordance with some embodiments of the present invention. Referring to FIG. 10, a dielectric layer 114, a second conductive layer 215, a control gate layer 116 and/or a second mask 118a may be formed on a first conductive layer pattern 106a and/or an isolation layer pattern 112a. Some embodiments provide that processes for forming the dielectric layer 114, the second conductive layer 215 and/or the second mask 118a may be substantially the same as those described with reference to FIG. 7.

In some embodiments, the second conductive layer 215 may be formed on the dielectric layer 114 using a material substantially the same as the first conductive layer pattern 106a. Some embodiments provide that the second conductive layer 215 may be formed using a transition metal, a transition metal nitride having a conductivity, and/or a transition metal oxide having a conductivity, among others. In some embodiments, the transition metal may include scandium, titanium, vanadium, chromium, manganese, iron, cobalt, nickel, copper, zinc, yttrium, zirconium, niobium, molybdenum, technetium, ruthenium, rhodium, palladium, silver, cadmium, lanthanum, hafnium, tantalum, tungsten, rhenium, osmium, iridium, platinum, gold, and/or actinium, among others. These may be used alone or in a combination thereof. Some embodiments provide that the transition metal nitride may include tantalum nitride and/or tungsten nitride, among others. These may be used alone or in a combination thereof. In some embodiments, the transition metal oxide may include ruthenium oxide.

Referring to FIG. 11, the control gate layer 116, the second conductive layer 215, the dielectric layer 114, the first preliminary conductive layer pattern 106a and/or the preliminary floating gate 104a may be etched using the second mask 118a as an etching mask until the tunnel insulation layer pattern 102a and/or the isolation layer pattern 112a are exposed. In this regard, a control gate 116a, a second conductive layer pattern 215a, a dielectric layer pattern 114a, a first conductive layer pattern 106b and/or a floating, gate 104b may be formed on the substrate 100.

In some embodiments, impurities are doped into upper portions of the substrate 100 adjacent the floating gate 104b so that impurity regions 120 may be formed at the portions of the substrate 100 adjacent the floating gate 104b. Some embodiments provide that the impurity regions 120 may serve as source/drain regions. The second mask 118a may then be removed.

In some embodiments, a gate structure 217 including the floating gate 104b, the first conductive layer pattern 106b, the dielectric layer pattern 114a, the second conductive layer pattern 215a and/or the control gate 116a may be formed on the substrate 100. As illustrated in FIG. 11, some embodiments provide that the gate structure 217 may extend along the second direction. In some embodiments, adjacent gate structures 217 may be spaced apart along the second direction. As a result, a non-volatile memory device including the substrate 100, the impurity regions 120, the tunnel insulation layer pattern 102a and/or the gate structure 217 may be provided on the substrate 100.

As described above, in some embodiments, the second mask 118a may extend along the second direction and adjacent second masks 118a may be separated from each other along the first direction. In some embodiments, the control gate 116a, the second conductive layer pattern 215a and/or the dielectric layer pattern 114a may be formed by etching the control gate layer 116, the second conductive layer 215 and/or the dielectric layer 114 using the second mask 118a as an etching mask. Some embodiments provide that the control gate 116a, the second conductive layer pattern 215a and/or the dielectric layer pattern 114a may extend along second direction. Adjacent control gates 116a may be spaced apart along the first direction and adjacent second conductive layer patterns 215a may be separated along the first direction. In some embodiments, adjacent dielectric patterns 114a may be separated along the first direction.

Hereinafter, manufacturing processes and characteristics of non-volatile memory devices according to various comparative examples and experimental examples will be described.

COMPARATIVE EXAMPLES

A non-volatile memory device according to Comparative Example 1 included a silicon oxide ($SiO_2$) layer as a tunnel insulation layer, an N type polysilicon layer as a floating gate, an aluminum oxide ($Al_2O_3$) layer as a dielectric layer, and a tantalum nitride (TaN) layer and a polysilicon layer as a control gate.

A non-volatile memory device according to Comparative Example 2 included a silicon oxide layer as a tunnel insulation layer, a polysilicon layer without impurities as a floating gate, an aluminum oxide layer as a dielectric layer, and a tantalum nitride layer and a polysilicon layer as a control gate.

A non-volatile memory device according to Comparative Example 3 included a silicon oxide layer as a tunnel insulation layer, a $P^-$ type polysilicon layer as a floating gate, an aluminum oxide layer as a dielectric layer, and a tantalum nitride layer and a polysilicon layer as a control gate.

A non-volatile memory device according to Comparative Example 4 included a silicon oxide layer as a tunnel insulation layer, a $P^+$ type polysilicon layer as a floating gate, an aluminum oxide layer as a dielectric layer, and a tantalum nitride layer and a polysilicon layer as a control gate.

Figure 12:
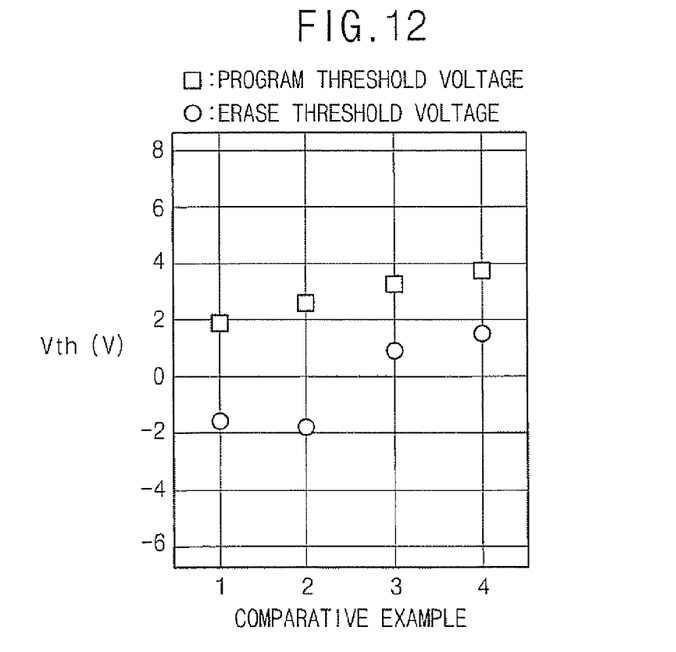
FIG. 12 is a graph illustrating comparative examples of threshold voltages in programming and erasing operations of non-volatile memory devices according to some embodiments of the present invention.

Reference is made to FIG. 12, which is a graph illustrating threshold voltages in programming and erasing operations of non-volatile memory devices according to Comparative Examples 1 to 4 described above. Threshold voltages required for programming and erasing operations of the non-volatile memory devices were respectively measured after applying predetermined voltages having opposite polarities and the same absolute values to the non-volatile memory devices according to Comparative Examples 1 to 4, respectively. The non-volatile memory devices of Comparative Examples 3 and 4 including the P type polysilicon layers as the floating gates had increased threshold voltages in the erasing operations compared with that of Comparative Example 1 including the N-type polysilicon layer as the floating gate and that of Comparative Example 2 having the polysilicon layer without impurities as the floating gate. In this regard, the non-volatile memory devices of Comparative Examples 3 to 4 may have deteriorated threshold voltages in the erasing operations thereof.

EXAMPLES

A non-volatile memory device according to Example 1 included a silicon oxide ($SiO_2$) layer as a tunnel insulation layer, an N type polysilicon layer and a tantalum nitride (TaN) layer as a floating gate, an aluminum oxide ($Al_2O_3$) layer as a dielectric layer, and a tantalum nitride (TaN) layer and a polysilicon layer as a control gate.

A non-volatile memory device according to Example 2 included a silicon oxide layer as a tunnel insulation layer, a polysilicon layer without impurities and a tantalum nitride layer as a floating gate, an aluminum oxide layer as a dielectric layer, and a tantalum nitride layer and a polysilicon layer as a control gate.

A non-volatile memory device according to Example 3 included a silicon dioxide layer as a tunnel insulation layer, a $P^-$ type polysilicon layer and a tantalum nitride layer as a floating, gate, an aluminum oxide layer as a dielectric layer, and a tantalum nitride layer and a polysilicon layer as a control gate.

A non-volatile memory device according to Example 4 included a silicon dioxide layer as a tunnel insulation layer, a $P^+$ type polysilicon layer and a tantalum nitride layer as a floating gate, an aluminum oxide layer as a dielectric layer, and a tantalum nitride layer and a polysilicon layer as a control gate.

Figure 13:
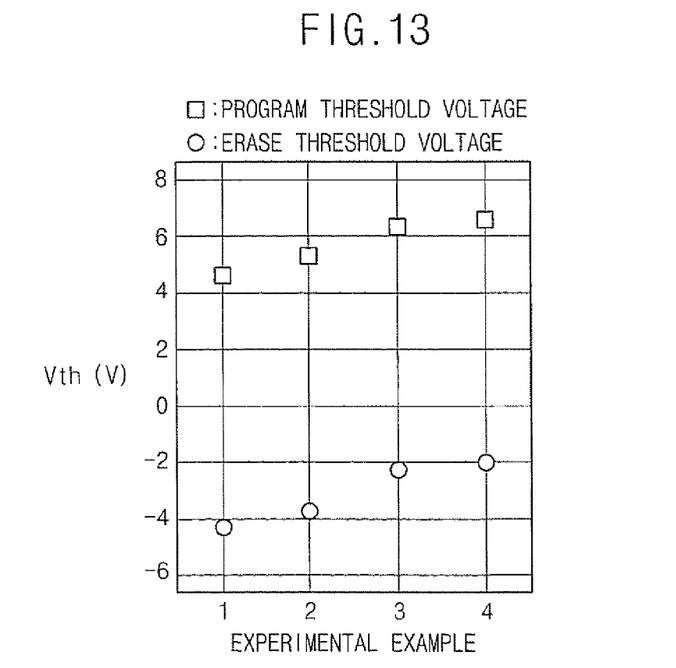
FIG. 13 is a graph illustrating experimental examples of threshold voltages in programming and erasing operations of non-volatile memory devices according to some embodiments of the present invention.

Reference is made to FIG. 13, which is a graph illustrating threshold voltages in programming and erasing operations of non-volatile memory devices according to Examples 1 to 4. Threshold voltages required for programming and erasing operations of the non-volatile memory device were respectively measured after applying predetermined voltages to the non-volatile memory devices according to Examples 1 to 4. The applied voltages had opposite polarities and the same absolute values relative to the non-volatile memory devices according to Examples 1 to 4, respectively. The non-volatile memory devices according to Examples 1 to 4 had differences of about 8V between the threshold voltages in the programming operations and the threshold voltages in the erasing operations, respectively. That is, the non-volatile memory devices according to Examples 1 to 4 had threshold voltages of about 4V larger than those of Comparative Examples 1 to 4. Thus, the non-volatile memory devices according to Examples 1 to 4 may provide desirably smaller threshold voltages in the programming operations and the erasing operations compared to the non-volatile memory devices according to Comparative Examples 1 to 4. Additionally, when the P type polysilicon layer served as the floating gate, the non-volatile memory devices according to Examples 3 and 4 did not have increased threshold voltages in the erasing operations. As a result, when the tantalum nitride layer was provided on the P type polysilicon layer serving as the floating gate, the non-volatile memory device did not have an increased threshold voltage in an erasing operation.

Figure 14:
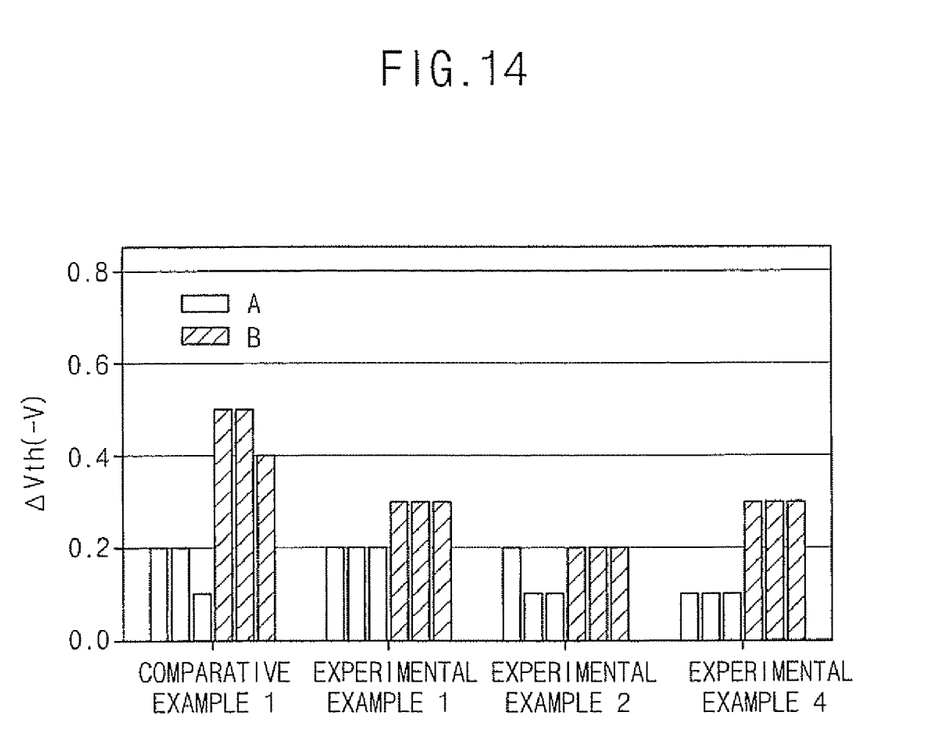
FIG. 14 is a graph illustrating high temperature stresses of the non-volatile memory devices of comparative and experimental examples according to some embodiments of the present invention.

Reference is now made to FIG. 14, which is a graph illustrating high temperature stresses of the non-volatile memory devices according to Comparative Examples and Examples. In FIG. 14, "A" represented a difference between initial threshold voltages of about 3.5V and threshold voltages measured after the programming operations of the non-volatile memory devices according Comparative Examples 1, 2 and 4 with the initial threshold voltages of about 3.5V. A heat treatment was executed for about 2 hours at a temperature of about 200° C. As the difference between the initial threshold voltages of about 3.5V and the threshold voltages measured after the heat treatment is reduced, data retention characteristics of the nonvolatile memory devices may be improved. Further, "B" showed a difference between initial threshold voltages of about 3.5V and threshold voltages measured after about 1,200 times repeating programming and erasing operations of the non-volatile memory devices according to Comparative Example 1 and Examples 1, 2 and 4 with the initial threshold voltages of about 3.5V. A heat treatment was carried out for about 2 hours at a temperature of about 200° C.

Referring to FIG. 14, when the programming operation was performed once in accordance with Comparative Example 1, the difference between the initial threshold voltage of about 3.5V and the threshold voltage after the heat treatment was about 0.2V. However, when the programming and the erasing operations were performed by about 1,200 times, the difference between the initial threshold voltage of about 3.5V and the threshold voltage after the heat treatment was increased to about 0.5V. Thus, when the N type polysilicon layer was used only as the floating gate, data retention characteristics of the non-volatile memory device were deteriorated.

When the programming operation of the non-volatile memory device according to Example 1 was preformed once, the difference between the initial threshold voltage of about 3.5V and the threshold voltage after performing the heat treatment was about 0.2V. However, when the programming and the erasing operations of the non-volatile memory device were performed by about 1,200 times, the difference between the initial threshold voltage and the threshold voltage after performing the heat treatment was increased to about 0.3V. Accordingly, when the tantalum nitride layer and the N type polysilicon layer were used as the floating gate, the data retention characteristics of the non-volatile memory device were improved.

When the programming operation of the non-volatile memory device according to Example 2 was performed once, the difference between the initial threshold voltage of about 3.5V and the threshold voltage after performing the heat treatment was about 0.1V. However, when the programming and the erasing operations of the non-volatile memory device were performed about 1,200 times, the difference between the initial threshold voltage and the threshold voltage after performing the heat treatment was increased to about 0.2V. Thus, when the tantalum nitride layer and the polysilicon layer without impurities were used as the floating gate, the data retention characteristics of the non-volatile memory device were enhanced.

When the programming operation of the non-volatile memory device according to Example 4 was performed once, the difference between the initial threshold voltage of about 3.5V and the threshold voltage after performing the heat treatment was about 0.1V. However, when the programming and the erasing operations of the non-volatile memory device were repeated about 1,200 times, the difference between the initial threshold voltage of about 3.5V and the threshold voltage after performing the heat treatment was increased to about 0.3V. That is, it was confirmed that data retention characteristics of the non-volatile memory device were improved when the tantalum nitride and the P type polysilicon layer were used as the floating gate.

When deterioration of the threshold voltage by a high temperature stress in the non-volatile memory device according to Comparative Example 1 was compared with that of the non-volatile memory devices according to Examples 1, 2 and 4, it was confirmed that the memory devices of Examples 1, 2 and 4 had threshold voltages which were less affected by the high temperature stresses than those of the non-volatile memory device according to Comparative Example 1. That is, the floating gate including the tantalum nitride layer and the polysilicon layer may have improved data retention characteristics compared with the floating gate including the polysilicon layer only.

Figure 15:
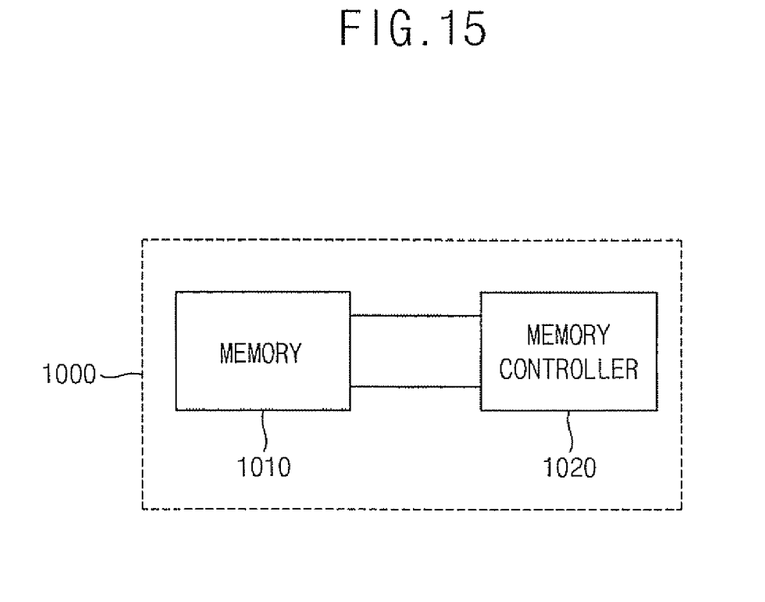
FIG. 15 is a block diagram illustrating a memory system including a non-volatile memory device in accordance with some embodiments of the present invention.

Reference is now made to FIG. 15, which is a block diagram illustrating a memory system having a non-volatile memory device in accordance with some embodiments of the present invention. In some embodiments, a memory system 1000 includes a memory device 1010 and a memory controller 1020 connected to the memory device 1010.

Some embodiments provide that the memory device 1010 may include a flash memory device having a gate structure in accordance with some embodiments disclosed herein. The flash memory device may correspond to a NAND type flash memory device and/or a NOR type flash memory device.

In some embodiments, the memory controller 1020 may provide input signal controlling operations of the memory device 1010. Some embodiments provide that the memory controller 1020 may provide commands (CMD) and/or address signals (ADD) in a NAND type flash memory device. In some embodiments, the memory controller 1020 may provide commands (CMD), address signals (ADD), input and/or output data (DQ) and/or high voltage signals (Vpp) in a NOR type flash memory device. Some embodiments provide that the memory controller 1020 may control the memory device 1010 by providing various control signals.

Figure 16:
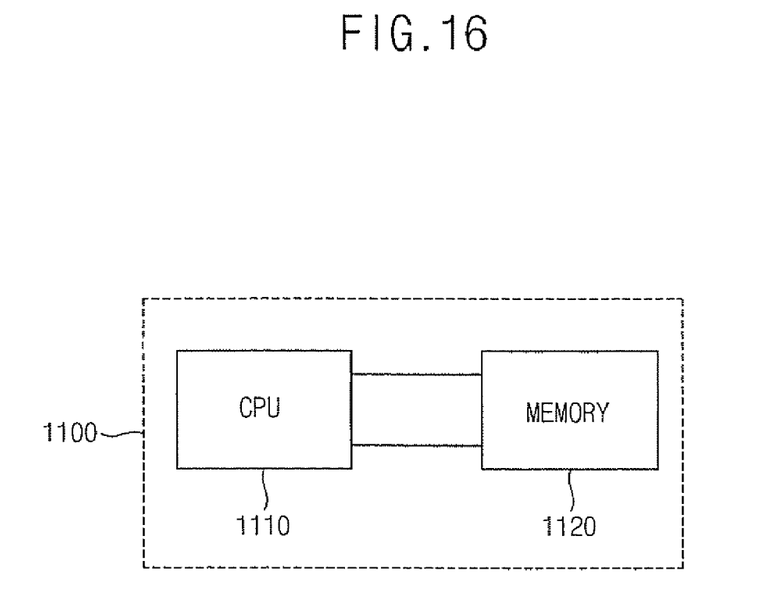
FIG. 16 is a block diagram illustrating a computer system including a non-volatile memory device in accordance with some embodiments of the present invention.

Reference is now made to FIG. 16, which is a block diagram illustrating a computer system having a non-volatile memory device in accordance with some embodiments of the present invention. In some embodiments, a computer system 1100 includes a memory device 1120 and/or a central process unit (CPU) 1110 connected to the memory device 1120. Some embodiments provide that the computer system 1100 may include a personal computer and/or a personal data assistant, among others. In some embodiments, the memory device 1120 may be directly connected to the CPU 1110 and/or may be connected to the CPU 1110 through a bus.

According to some embodiments of the present invention, a dielectric layer pattern of a non-volatile memory device having a high dielectric material may have improved an equivalent oxide thickness, so that a leakage current flowing through the dielectric layer pattern may be reduced. Some embodiments provide that a threshold voltage in an erasing operation of the non-volatile memory device may be improved because of a floating gate including polysilicon and/or transition metal.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A non-volatile memory device, comprising:
an isolation layer pattern on a substrate, the isolation layer pattern extending in a first direction;
a tunnel insulation layer pattern on the substrate between the isolation layer pattern, each portion of the tunnel insulation pattern extending along a first direction, adjacent portions of the tunnel insulation layer pattern being separated in a second direction that is substantially perpendicular to the first direction; and
a gate structure formed on the tunnel insulation layer pattern, the gate structure comprising
a floating gate formed on the tunnel insulation layer pattern,
a first conductive layer pattern formed on the floating gate, the first conductive layer pattern being separated both in the first and second directions,
a dielectric layer pattern formed on the first conductive layer pattern along the second direction, and
a control gate formed on the dielectric layer pattern in the second direction,
wherein an upper face of the isolation layer pattern has a level higher than an upper face of the first conductive layer pattern and lower than an upper face of the dielectric layer pattern, and
wherein the first conductive layer directly contacts a bottom surface of the dielectric layer.

2. The non-volatile memory device of claim 1, wherein the first conductive layer pattern comprises a transition metal, a transition metal nitride having a conductivity, and/or a transition metal oxide having a conductivity.

3. The non-volatile memory device of claim 2, wherein the transition metal comprises scandium (Sc), titanium (Ti), vanadium (V), chromium (Cr), manganese (Mn), iron (Fe), cobalt (Co), nickel (Ni), copper (Cu), zinc (Zn), yttrium (Y), zirconium (Zr), niobium (Nb), molybdenum (Mo), technetium (Tc), ruthenium (Ru), rhodium (Rh), palladium (Pd), silver (Ag), cadmium (Cd), lanthanum (La), hafnium (Hf), tantalum (Ta), tungsten (W), rhenium (Re), osmium (Os), iridium (Ir), platinum (Pt), gold (Au) and/or actinium (Ac).

4. The non-volatile memory device of claim 2, wherein the transition metal nitride comprises tantalum nitride (TaNx) and/or tungsten nitride (WNx), and wherein the transition metal oxide comprises ruthenium oxide (RuOx).

5. The non-volatile memory device of claim 1, further comprising a groove formed on an upper portion of the substrate, wherein a lower portion of the isolation layer pattern fills the groove and an upper portion of the isolation layer pattern is disposed between each of a plurality of adjacent gate structures.

6. The non-volatile memory device of claim 1, wherein the isolation layer pattern comprises an upper face that is substantially higher than that of the first conductive layer pattern.

7. The non-volatile memory device of claim 6, wherein the dielectric layer pattern comprises a metal oxide including a dielectric constant that is substantially higher than that of silicon oxide, wherein the floating gate comprises polysilicon and/or polysilicon doped with impurities, and wherein the first conductive layer pattern comprises tantalum nitride.

8. The non-volatile memory device of claim 1, wherein the dielectric layer pattern comprises aluminum oxide, lanthanum oxide, yttrium oxide, cerium oxide, tantalum oxide, vanadium oxide, zirconium oxide, hafnium aluminate, hafnium silicate and/or zirconium silicate.

9. The non-volatile memory device of claim 1, further comprising a second conductive layer pattern that is formed between the dielectric layer pattern and the control gate, wherein the second conductive layer pattern extends along the second direction and comprises a material substantially the same as that of the first conductive layer pattern.

10. A method of manufacturing a non-volatile memory device, comprising:
    forming a tunnel insulation layer, a floating gate layer and a first conductive layer on a substrate;
    etching the tunnel insulation layer, the floating gate layer and the first conductive layer along a first direction to form a tunnel insulation layer pattern, a preliminary floating gate and a first conductive layer pattern on the substrate, wherein the tunnel insulation layer pattern, the preliminary floating gates and the first conductive layer pattern extend along the first direction and are spaced apart along a second direction;
    forming an isolation layer pattern extending the first direction and isolating the tunnel insulation layer pattern, the preliminary floating gate and the first conductive layer pattern along the second direction;
    forming a dielectric layer and a control gate layer on the first conductive layer pattern and the isolation layer pattern; and
    etching the control gate layer, the dielectric layer, the first conductive layer pattern and the preliminary floating gate along the second direction to form a control gate, a dielectric layer pattern, a first conductive layer pattern and a floating gate on the substrate,
    wherein the control gates and the dielectric layer pattern extend along the second direction and are separated along the first direction,
    wherein the first conductive layer pattern and the floating gate are spaced apart along the first and the second directions, and
    wherein an upper face of the isolation layer pattern has a level higher than an upper face of the first conductive layer pattern and lower than an upper face of the dielectric layer pattern.

11. The method of claim 10, wherein the first conductive layer pattern comprises a transition metal, a transition metal nitride having a conductivity, and/or a transition metal oxide having a conductivity.

12. The method of claim 11, wherein the transition metal comprises scandium (Sc), titanium (Ti), vanadium (V), chromium (Cr), manganese (Mn), iron (Fe), cobalt (Co), nickel (Ni), copper (Cu), zinc (Zn), yttrium (Y), zirconium (Zr), niobium (Nb), molybdenum (Mo), technetium (Tc), ruthenium (Ru), rhodium (Rh), palladium (Pd), silver (Ag), cadmium (Cd), lanthanum (La), hafnium (Hf), tantalum (Ta), tungsten (W), rhenium (Re), osmium (Os), iridium (Ir), platinum (Pt), gold (Au) and/or actinium (Ac).

13. The method of claim 11, wherein the transition metal nitride comprises tantalum nitride (TaNx) and/or tungsten nitride (WNx), and wherein the transition metal oxide comprises ruthenium oxide (RuOx).

14. The method of claim 10, wherein the dielectric layer pattern comprises a metal oxide including a dielectric constant that is substantially higher than that of silicon oxide, wherein the floating gate comprises polysilicon and/or polysilicon doped with impurities, and wherein the first conductive layer pattern comprises tantalum nitride.

15. The method of claim 10, further comprising forming impurity regions at portions of the substrate adjacent at least one of the plurality of floating gates.

16. The method of claim 10, further comprising:
    forming a second conductive layer between the dielectric layer and the control gate layer using a material that is substantially the same as that of the first conductive layer; and
    etching the second conductive layer along the second direction to form a second conductive layer pattern between the dielectric layer pattern and the plurality of control gates,
    wherein the second conductive layer pattern is configured to extend along second direction and adjacent portions of the second conductive layer pattern are separated along the first direction.

17. A method of manufacturing a semiconductor device, comprising:
    sequentially forming a tunnel insulation layer, a floating gate layer, a first conductive layer and an etching stop layer on a substrate;
    sequentially etching the etching stop layer, the first conductive layer, the floating gate layer, the tunnel insulation layer and an upper portion of the substrate along a first direction to form a tunnel insulation layer pattern, a preliminary floating gate, a first conductive layer pattern and an etching stop layer pattern extending along the first direction and separated along a second direction that is substantially perpendicular to the first direction, the sequentially etching operative to form a plurality of grooves extending along the first direction and that are spaced apart along the second direction;
    forming an isolation layer filling up the plurality of grooves on the substrate, the tunnel insulating layer pattern, the preliminary floating gate, the first conductive layer pattern and the etching stop layer pattern;

partially removing the isolation layer until the etching stop layer pattern is exposed, to form an isolation layer pattern;

removing the etching stop layer pattern;

forming a dielectric layer and a control gate layer on the first conductive layer pattern and the isolation layer pattern; and etching the control gate layer, the dielectric layer, the first conductive layer pattern and the preliminary floating gate along the second direction to form a plurality of control gates and a dielectric layer pattern extending along the second direction and spaced apart along the first direction, the etching operative to form a first conductive layer pattern and a floating gate separated along the first and the second directions, wherein an upper face of the isolation layer pattern has a level higher than an upper face of the first conductive layer pattern and lower than an upper face of the dielectric layer pattern.

18. The method of claim 17, wherein the first conductive layer pattern comprises a transition metal, a transition metal nitride having a conductivity and/or a transition metal oxide having a conductivity, wherein the floating gate comprises polysilicon and/or polysilicon doped with impurities, and wherein the first conductive layer pattern comprises tantalum nitride.

19. The method of claim 17, further comprising:

forming a second conductive layer between the dielectric layer and the control gate layer using a material substantially the same as that of the first conductive layer; and etching the second conductive layer along the second direction to form a second conductive layer pattern between the dielectric layer pattern and the plurality of control gates, wherein the second conductive layer pattern extends along the second direction and adjacent portions of the second conductive layer pattern are separated along the first direction.

* * * * *